US008780565B2

(12) United States Patent
Henderson

(10) Patent No.: US 8,780,565 B2
(45) Date of Patent: Jul. 15, 2014

(54) INFORMATION HANDLING SYSTEM SLIDE RAIL ALIGNMENT SUPPORT

(75) Inventor: Gregory Lane Henderson, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 650 days.

(21) Appl. No.: 13/032,061

(22) Filed: Feb. 22, 2011

(65) Prior Publication Data

US 2012/0212894 A1 Aug. 23, 2012

(51) Int. Cl.
*H05K 5/00* (2006.01)

(52) U.S. Cl.
USPC ..... 361/727; 312/330.1; 312/321; 312/319.1; 312/301; 361/724; 384/18

(58) Field of Classification Search
CPC .............. A47B 2088/0448; A47B 2210/0024; A47B 2088/0459; A47B 2210/0094; A47B 63/00; A47B 88/0422; A47B 88/0466; A47B 88/047; A47B 67/02; A47B 67/04; F25D 25/025; E05Y 2201/722; A47F 3/0439; A47F 3/06; A47L 15/0081; H04M 1/0237
USPC .......... 361/679.02, 724, 727; 312/330.1, 321, 312/301, 319.1; 384/18
See application file for complete search history.

(56) References Cited

U.S. PATENT DOCUMENTS

| 6,378,969 | B1 * | 4/2002 | Ferrari et al. ............ 312/334.44 |
| 6,424,534 | B1 | 7/2002 | Mayer et al. |
| 6,557,960 | B2 * | 5/2003 | Shih .......................... 312/334.5 |
| 6,930,887 | B2 | 8/2005 | Hartman |
| 7,308,184 | B2 * | 12/2007 | Barnes et al. ................. 385/135 |
| 7,465,000 | B2 * | 12/2008 | Huang .......................... 312/333 |
| 7,826,210 | B2 | 11/2010 | Cravens et al. |
| 2010/0140195 | A1 | 6/2010 | Henderson et al. |
| 2010/0282932 | A1 * | 11/2010 | Ong et al. .................. 248/206.5 |

* cited by examiner

*Primary Examiner* — Robert J Hoffberg
*Assistant Examiner* — Hung Dang
(74) *Attorney, Agent, or Firm* — Terrile, Cannatti, Chambers & Holland, LLP; Robert W. Holland

(57) ABSTRACT

A rail assembly having a stab-in inner rail member that inserts into and withdraws from an intermediate rail member supports an information handling system chassis disposed in a rack. Insertion of the inner rail member into the intermediate rail member is aided by a resting surface extending from the insertion end of the intermediate rail member. The inner rail member rests on and is aligned with the resting surface so that opposing pairs of rail assemblies can have their inner rail members aligned with their intermediate rail members during a stab-in assembly of a chassis into the rack.

20 Claims, 2 Drawing Sheets

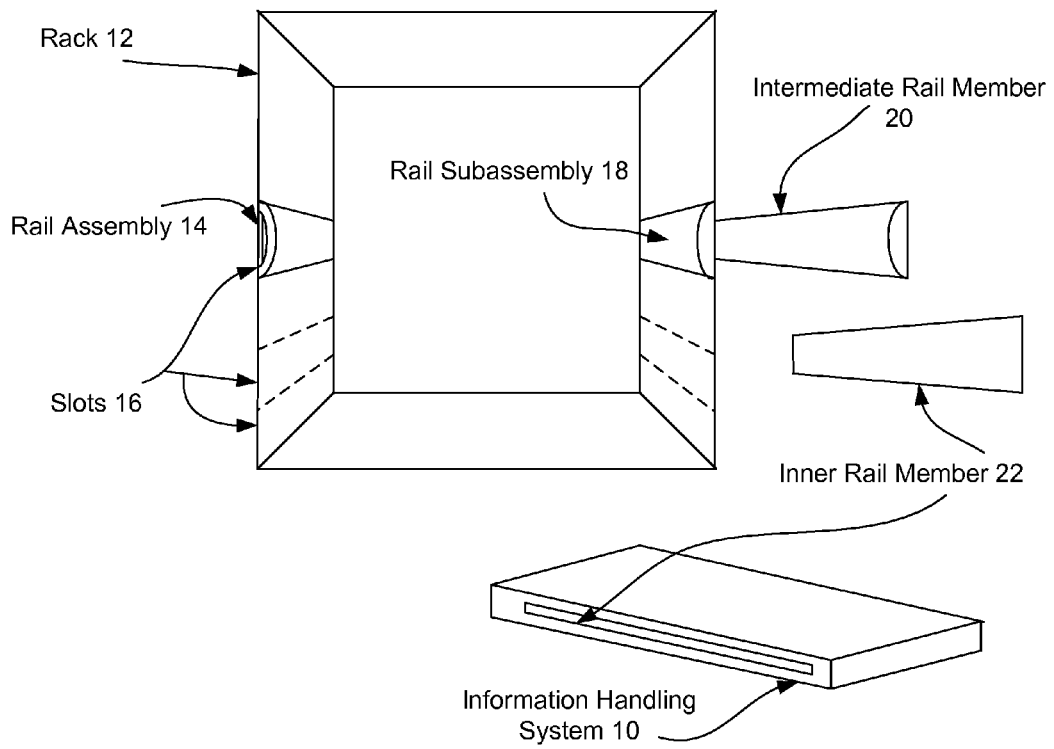
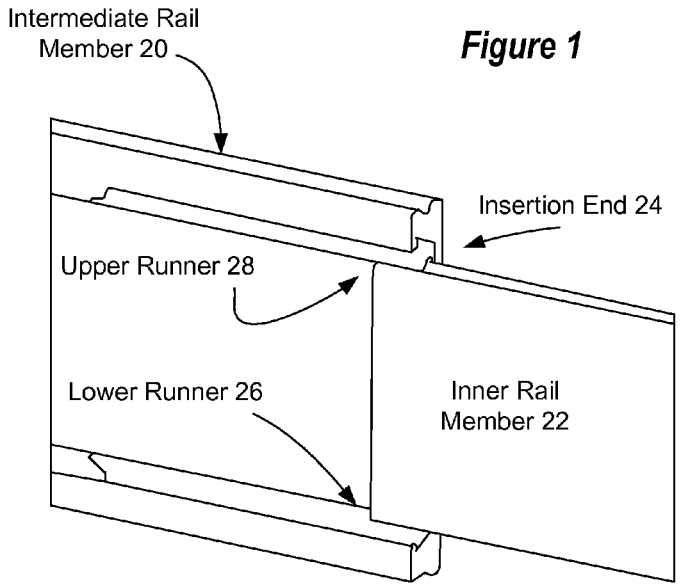
*Figure 1*
*Figure 2 (Prior Art)*

INFORMATION HANDLING SYSTEM SLIDE RAIL ALIGNMENT SUPPORT

BACKGROUND OF THE INVENTION

1. Field of the Invention

The present invention relates in general to the field of information handling system rack mounting rails, and more particularly to an information handling system slide rail alignment support.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Server information handling systems and other data center equipment are typically mounted in racks using telescoping slide rails. One rack often holds numerous information handling systems stacked vertically in order to maintain the systems in a safe and secure environment. Power and cooling resources are generally applied through the rack structure so that the information handling systems in the rack are enclosed in the rack structure unless maintenance or replacement of a particular chassis is required. When access is needed to a particular chassis, the chassis is slid from the rack with the telescoping slide rails. Often, the chassis is completely removed so that internal components are readily accessible or so that a replacement chassis can be inserted in its place. To provide ready access to a chassis in a rack, one common method for mounting the chassis in the rack is the "stab-in" method, which involves removing inner members from the rail assemblies, attaching the inner members to the sides of the chassis being installed into the rack, and then re-installing or "stabbing" the inner members back into the rail subassemblies that are installed in the rack. One difficulty with stab-in rail assemblies is that a user typically has to align and insert both sides of the rail assembly simultaneously or get one side inserted and prevent the inserted side from disengaging while attempting to insert the other side.

Generally, end users prefer to have server information handling systems displace a small footprint since datacenter space comes at a premium. Within a server rack, information handling systems come in a variety of heights defined by a standardized rack unit, or "U," such as a 1 U or 2 U chassis. However, the widths of all information handling systems and their associated rack mounting hardware must fit within a fixed value governed by the same rack standard. Therefore the only way to incorporate larger components or a higher quantity of components inside an information handling system without increasing its overall footprint within the rack is to increase its width. As a result, the rail assemblies used to support the chassis in the racks have tended to become narrower over time. The trend in the use of narrower rail assemblies is likely to continue. The narrower rail assemblies tend to make it more difficult to manipulate a chassis for installation into a rack. For example, one of the main challenges with stab-in rail assembly structures is properly aligning inner rail members back into rack rail subassemblies during installation or replacement of the chassis into the rack. Smaller-sized rails are difficult to handle and susceptible to physical damage in the event of application of force along axes that are not intended to withstand excessive force, such as with twisting movements. Small misalignments during a stab-in of a rail can damage the rail or put the chassis in an unsecure or unstable state. As the information handling system industry trends towards narrower slide rail profiles, proper alignment by an end user of inner members with a rail assembly during insertion of the chassis into the rack has become a greater challenge for the end user.

SUMMARY OF THE INVENTION

Therefore a need has arisen for a system and method which aids alignment of a rail inner member to a rail subassembly during insertion of an information handling system chassis into a server rack.

In accordance with the present invention, a system and method are provided which substantially reduce the disadvantages and problems associated with previous methods and systems for inserting an inner rail member into a rail subassembly to insert an information handling system chassis into server rack. A resting surface at an insertion end of an intermediate rail member accepts the inner rail member before insertion to aid alignment of opposing rail assemblies at a rack during insertion of an information handling system.

More specifically, a rack having plural slots holds an information handling system chassis in each slot with a pair of rail assemblies disposed at opposing sides of each slot. The rail assembly includes a subassembly coupled to the rack and having an intermediate member that extends out from the rack. An inner rail member slides into and withdraws from the intermediate rail member. The inner rail member couples to an information handling system chassis so that the chassis is inserted into the rack by inserting first and second inner rail members on opposing sides of the chassis into first and second intermediate rail members of rail subassemblies disposed on opposing sides of a slot in the rack. A resting surface extending from the lower portion of each intermediate rail member insertion end accepts the weight of the inner rail members during insertion of the chassis to aid alignment of the inner rail members with the intermediate rail members during a stab-in insertion of the inner rail members into the intermediate rail members.

The present invention provides a number of important technical advantages. One example of an important technical advantage is that inner rail members of a stab-in style slide rail are properly aligned with the aid of a landing pad guide, thus reducing the challenge faced by an end user who installs a stab-in style rail into a rail subassembly. The alignment and temporary resting place provided by the guide during the installation process reduces the risk of damage to the rail assembly and information handling system chassis by preventing the system from entering an unstable or unsecure state during installation. Increased stability during rail assembly for a stab-in chassis insertion helps to make more practical the use of narrow slide assembly profiles associated with larger information handling system chassis. Greater ease of assembly reduces the difficulty faced by end users when performing information handling system initial installation, maintenance or replacement at a server rack.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 1 depicts a rack that holds plural information handling systems on stab-in rail assemblies;

FIG. 2 depicts a conventional stab-in rail assembly; and

DETAILED DESCRIPTION

Figure 3:
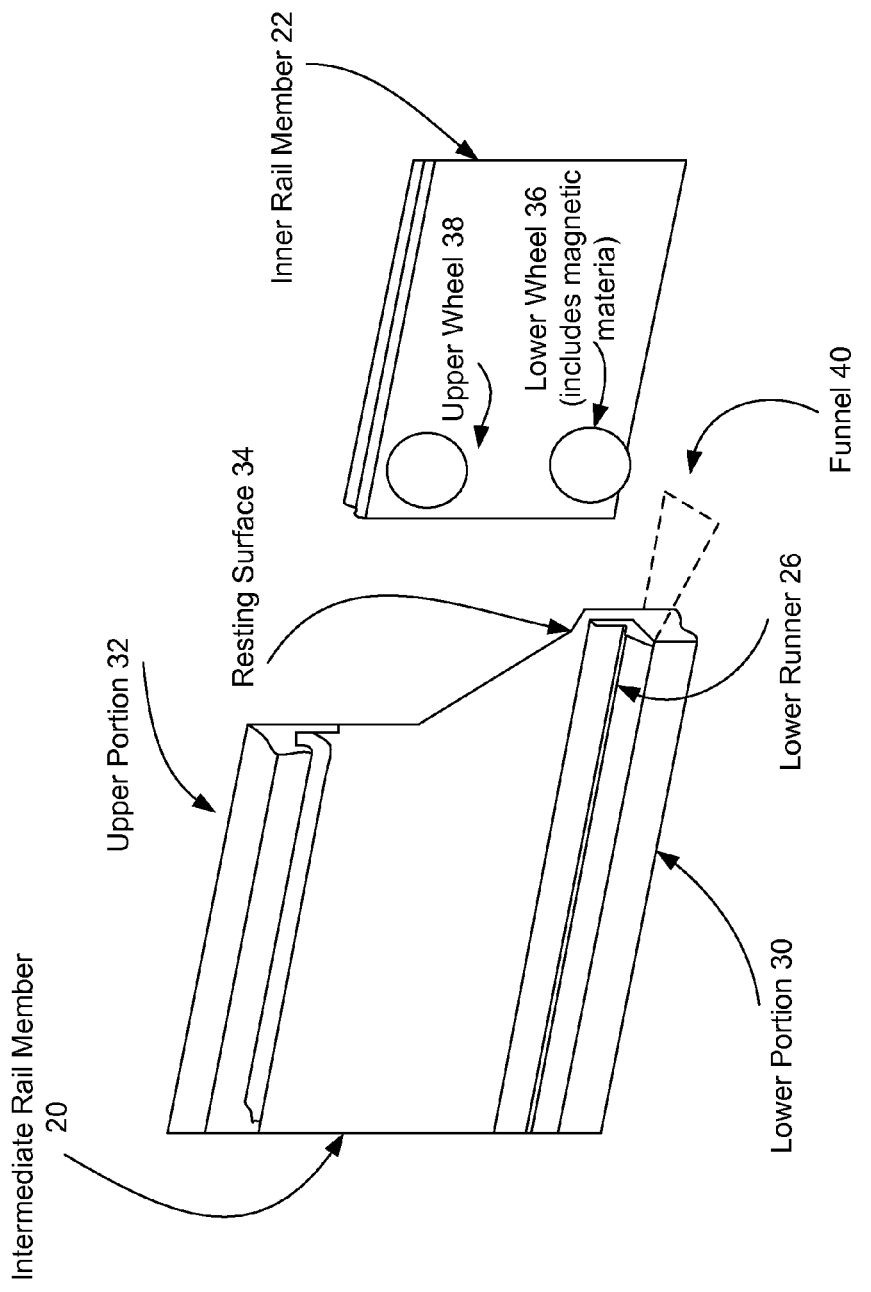
FIG. 3 depicts a stab-in rail assembly having a resting place at the insertion end of an intermediate rail member that accepts an inner rail member during a stab-in insertion.

A resting surface at the insertion end of a rail assembly intermediate rail member aids stab-in assertion of an inner rail member that is coupled to an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to FIG. 1, a rack 12 that holds plural information handling systems 10 on stab-in rail assemblies 14 is depicted. Rack 12 has an open front face and plural slots 16, each slot sized to accept an information handling system 10. On opposing interior sides of rack 12 at each slot 16, a rail assembly couples to rack 12 to support an information handling system 10 so that the information handling system 10 slides into and out of the interior of rack 12. Each information handling system 10 is built with plural processing components disposed in a housing, such as a CPU, RAM, a chipset and a hard disk drive. The processing components cooperate to perform a processing function, such as a server or storage function.

Each rail assembly 14 has a subassembly 18 coupled to rack 12 with an integrated intermediate rail member 20 and a detachable inner rail member 22. Intermediate rail member 20 slides within subassembly 18 between a retracted position within the interior of rack 12 and an extended position at the exterior of rack 12. Inner rail member 22 couples to opposing sides of information handling system 10 so that inner rail members 22 align to couple with intermediate rail members 20 extending from rail assemblies coupled in rack 12 at opposing sides of a slot 16. To insert an information handling system 10 into a slot 16, inner rail members 22 coupled to information handling system 10 are aligned with intermediate rail members 20 extending from rack 12 and stabbed into intermediate rail members 20. Once engaged in intermediate rail members 20, inner rail members 22 slide into intermediate rail members 20 which in turn slide into rail subassembly 18 until information handling system 10 is held within the interior of rack 12. To remove an information handling system 10 from rack 12, inner rail member 22 slides out of intermediate rail member 20 and disengages from intermediate rail 20.

Referring now to FIG. 2, a conventional stab-in rail assembly is depicted. Intermediate rail member 20 extends outward to expose an insertion end 24, which accepts inner rail member 22 between a lower runner 26 and an upper runner 28. Since both lower runner 26 and upper runner 28 align with insertion end 24, engaging inner rail member 22 at insertion end 24 generally calls for both top and bottom portions of inner rail member 22 to align simultaneously for the rail assemblies on both sides of a slot. Simultaneous alignment of inner rail member 22 at lower runner 26 and upper runner 28 tends to be difficult, especially with small-sized rail assemblies. If the rail assembly on one side assembles by stabbing inner rail member 22 through insertion end 24, the process of assembling the rail assembly on the opposing side can introduce a twisting force that damages the rail assembly or information handling system.

Referring now to FIG. 3, a stab-in rail assembly is depicted having a resting surface 34 at the insertion end 24 of an intermediate rail member 20 that accepts an inner rail member 22 during a stab-in insertion. Resting surface 34 is a portion of intermediate rail member 20 that extends outward to provide a place for inner rail member 22 to land during stab-in insertion to intermediate rail member 20. Resting surface 34 is an extension of the lower portion 30 of intermediate rail 20 by a greater distance than upper portion 32 extends so that inner rail member 22 lands on resting surface 34 to await insertion into intermediate rail member 20. In one embodiment, resting surface 34 includes an extension of lower runner 26 so that a lower wheel 36 of inner rail member 22 helps to align inner rail member 22 with intermediate rail member 20 before a stab-in insertion brings an upper wheel 38 into upper runner 28 of upper portion 32. In an alternative embodiment, a biasing device helps to obtain alignment of inner rail member 22 with intermediate rail member 20 to ease the insertion process. For example, a funnel shape 40, indicated by dotted lines, is included at resting surface 34 to help guide inner rail member 22 to a proper position for insertion into intermediate rail member 20. As another example, an arrangement of like and unlike poles of magnets can help to guide inner rail member 22 to a proper position for insertion into intermediate rail member 20, such as by including a rotatable magnet on lower wheel. With each embodiment, the goal is to have resting surface 34 provide a temporary landing space for inner rail member 22 during a stab-in insertion so that stability is provided while rail assemblies on opposites sides of a slot are secured at both the upper and lower portions of intermediate rail members 20.

Although the present invention has been described in detail, it should be understood that various changes, substitutions and alterations can be made hereto without departing from the spirit and scope of the invention as defined by the appended claims.

What is claimed is:

1. An information handling system comprising:
   a rack having plural slots, each slot sized to accept an information handling system chassis;
   a rail assembly coupled to the rack at opposing sides of each of the slots, each rail assembly having an intermediate rail member with an insertion end that extends out of the rack, the intermediate rail member operable to accept insertion of an inner rail member, the insertion end having a lower portion that extends outward a greater distance than an upper portion, the lower portion sized to support the inner rail member;
   a chassis having plural processing components disposed in said chassis and operable to cooperate to process information; and
   first and second inner rail members coupled to opposing sides of the chassis and sized to rest on the intermediate rail member lower portions and slide into the intermediate rail members.

2. The information handling system of claim 1 wherein the processing components comprise a server device.

3. The information handling system of claim 1 wherein the processing components comprise a storage device.

4. The information handling system of claim 1 further comprising a biasing device disposed at the lower portion, the biasing device operable to bias the inner rail member into alignment with the intermediate rail member.

5. The information handling system of claim 4 wherein the biasing device comprises a runner that accepts a lower wheel of the inner rail member before an upper wheel of the inner rail member is in position to enter an upper runner of the intermediate rail member.

6. The information handling system of claim 4 wherein the biasing device comprises a funnel that guides the inner rail member into the intermediate rail member.

7. The information handling system of claim 4 wherein the biasing device comprises a magnet disposed to attract the inner rail member to an aligned position.

8. The information handling system of claim 1 further comprising plural chassis, each chassis having first and second inner rail members, each inner rail member inserted into an intermediate rail member.

9. A method for inserting an information handling system chassis into a rack, the method comprising:
   coupling first and second inner rail members to opposing sides of the chassis;
   aligning the first and second inner rail members with first and second intermediate rail members extending from the rack;
   resting the first and second inner rail members on a resting surface extending from a lower portion of the intermediate rail, the resting surface extending outwards a greater distance than an upper portion of the intermediate rail; and
   pushing the first and second inner rail members across the resting surfaces to engage the first and second intermediate rail members.

10. The method of claim 9 wherein the chassis contains processing components to perform a server function.

11. The method of claim 9 wherein the chassis contains processing components to perform a storage function.

12. The method of claim 9 further comprising biasing the inner rail members to predetermined position at the resting surface that aligns the inner rail member to insert into the intermediate rail member.

13. The method of claim 12 wherein biasing further comprises engaging the inner rail member with a funnel that guides insertion of the inner rail member into the intermediate rail member.

14. The method of claim 13 wherein biasing further comprises directing alignment of the inner rail member in the intermediate rail member with a magnet.

15. A rail assembly comprising:
   a rail subassembly having a base that couples to a rack and an intermediate rail member operable to slide within the base between a retracted position and an extended position;
   an inner rail member operable to slide within the intermediate rail member between a retracted position and an extended position, the inner rail member further operable to withdraw from the intermediate rail member and to insert into the intermediate rail at an insertion point of the intermediate rail; and
   a resting portion disposed at the intermediate rail insertion point to hold the inner rail member before insertion of the inner rail member into the intermediate rail member, the resting portion extending outwards from the intermediate rail past an upper portion of the intermediate rail.

16. The rail assembly of claim 15 wherein the resting portion further comprises an extension of the insertion portion at a lower portion of the intermediate rail.

17. The rail assembly of claim 15 further comprising a biasing device disposed at the insertion portion, the biasing device operable to bias the inner rail member from the resting portion to insert into the intermediate rail member.

18. The rail assembly of claim 17 wherein the biasing device comprises a funnel.

19. The rail assembly of claim 17 wherein the biasing device comprises a magnet.

20. The rail assembly of claim 17 wherein the biasing device comprises a runner that accepts a lower wheel of the inner rail member to guide the inner rail member into the intermediate rail member.

* * * * *